United States Patent [19]

DeWalch

[11] Patent Number: 5,001,912
[45] Date of Patent: Mar. 26, 1991

[54] LOCKABLE METER CLAMP RING

[76] Inventor: Norman B. DeWalch, 6850 Wynnwood St., Houston, Tex. 77008

[21] Appl. No.: 287,783

[22] Filed: Dec. 20, 1988

Related U.S. Application Data

[63] Continuation-in-part of Ser. No. 114,321, Oct. 26, 1987, abandoned, which is a continuation-in-part of Ser. No. 1,125, Jan. 7, 1987, Pat. No. 4,702,093, which is a continuation-in-part of Ser. No. 786,831, Oct. 11, 1985, abandoned.

[51] Int. Cl.⁵ .................... B65D 55/14; G10R 11/04
[52] U.S. Cl. ................................. 70/164; 292/256.6
[58] Field of Search ................ 70/19, 158, 163–173; 292/256.6, 256.63, 256.65, 256.69

[56] References Cited

U.S. PATENT DOCUMENTS

| | | | |
|---|---|---|---|
| 2,236,649 | 4/1941 | Proctor | 292/256.69 |
| 3,861,180 | 1/1975 | Heckrotte | 70/164 |
| 4,702,093 | 10/1987 | Dowalch | 70/164 |

Primary Examiner—Robert L. Wolfe
Attorney, Agent, or Firm—Fulbright & Jaworski

[57] ABSTRACT

A lockable clamp ring for securing an electric meter to a meter housing flange, which incorporates a unitary structure with moveable parts. The ends of the split ring are moved by spreading means which can be manipulated by means of a housing to hold the ring closed, where it may be locked to secure the meter to the flange; and to hold the ring open, when it is desired to remove the ring or meter.

13 Claims, 20 Drawing Sheets

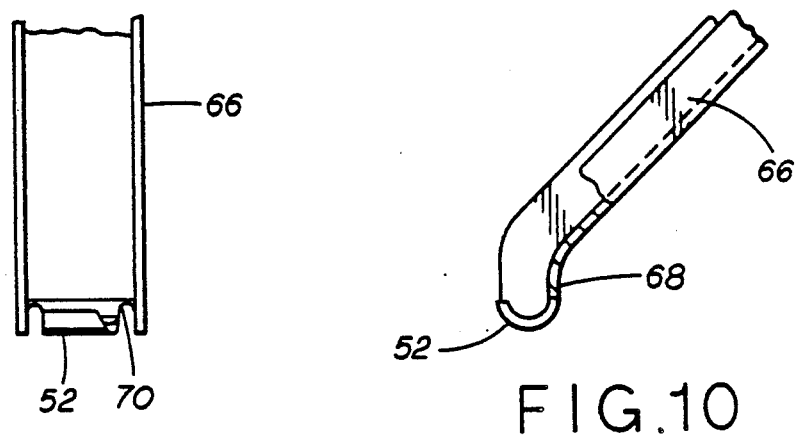
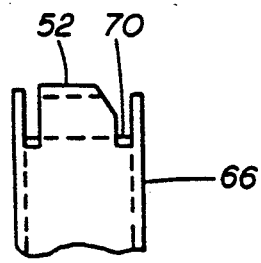
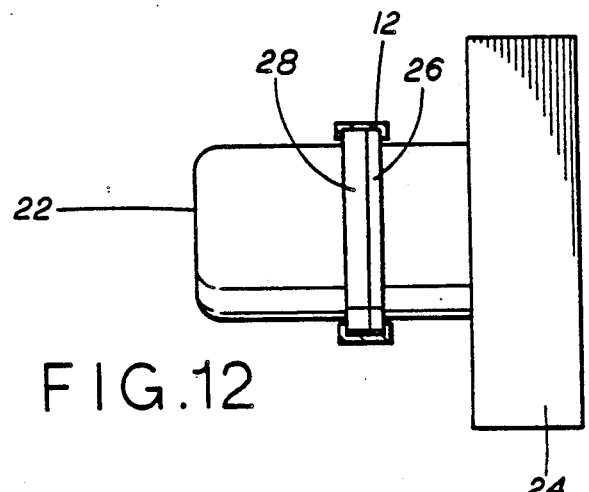
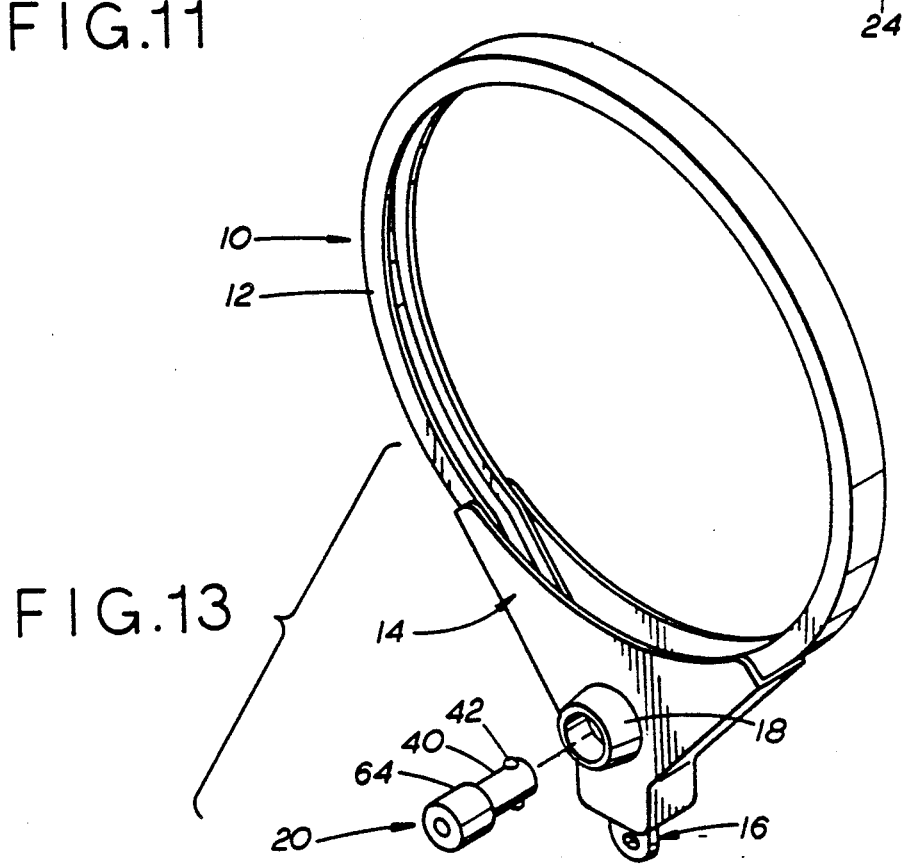

LOCKABLE METER CLAMP RING

This application is a continuation-in-part of my co-pending application Ser. No. 07/114,321 filed Oct. 26, 1987, now abandoned which is a continuation-in-part of my co-pending application, Ser. No. 07/001,125 filed Jan. 7, 1987 entitled Lockable Meter Clamp Ring, now U.S. Pat. No. 4,702,093, which is a continuation-in-part of my co-pending application Ser. No. 06/786,831 filed Oct. 11, 1985, now abandoned.

BACKGROUND OF THE INVENTION

The present invention relates to an improved clamping ring for use with an electric utility meter, and more particularly for an improved clamp ring which is used to secure the meter to its housing.

Typically the electric meter housing has a circular flange which extends radially outwardly from the housing. The electric meter itself has a somewhat wider circular flange or base which fits against the housing flange. A split U-shaped clamping ring is then placed over both of these flanges to hold the meter to the meter housing, and in turn, some method must be provided for securing the ends of the ring, and to provide a means for locking it over the joint, so that the meter may not be removed and be tampered with. Thus, the object of such a clamp ring is to prevent unauthorized access to the backside of the meter.

Clamp rings of the same general sort are shown in U.S. Pat. Nos. 3,867,822; 4,158,953; 4,413,490; and 4,415,190. The present invention provides a unique method to prevent the clamp ring from being removed from the meter housing when an appropriate lock is in place, and at the same time provides a unique method to open the ends of the ring so that it may be more readily removed from the meter base, so that the meter can be changed, or removed, as desired and a unique method to close the ring.

More particularly, the prior devices have been somewhat hard to manipulate, and particularly to spread the ends of the ring far enough apart to get it over the flanges, and to then bring the two ends together so that a housing may be installed to hold the ends in a position to lock the meter to the case, and then thereafter to install a lock and a seal. The present invention is directed toward improvements which overcome these objections.

SUMMARY OF THE INVENTION

The present invention provides a clamp ring for a meter and the meter housing which uses specially shaped arms and lugs formed in the ring ends, and integral means which interact with the ring to spread the ends of the ring apart for removal from or insertion over the meter. The invention also provides means for easily contracting the ring to clamp, and thereafter lock, the ring in place. Further, the entire clamp ring can be constructed as a unitary piece, with several moving parts, thereby avoiding the tendency to drop or lose parts of multiple part assemblies.

Thus, it is an object of the present invention to provide a clamp ring in a unitary structure which is stable in the closed position.

It is the further object of the present invention to provide a clamp ring which is relatively easy to manipulate, and at the same time is tamper resistant.

Other and further objects, features and advantages will be apparent from the following description of the presently preferred embodiments of the invention, given for the purpose of disclosure, when taken in conjunction with the accompanying drawings:

BRIEF DESCRIPTION OF THE DRAWINGS

Like character references designate like parts throughout the several views of the drawings, which are:

FIG. 9 is a partial side view of the inside of the bottom arm, extension and lug of the ring.

FIG. 10 is a front view, partially in section of the arm shown in FIG. 9.

FIG. 11 is a partial bottom view looking up at the lug shown in FIG. 9.

FIG. 12 is a top view, partially in section, showing an electric meter mounted on a meter box with the clamp ring in place.

FIG. 13 is a perspective view of the clamp ring in closed position ready for insertion of a barrel lock.

DESCRIPTION OF THE PREFERRED EMBODIMENTS

Figure 1:
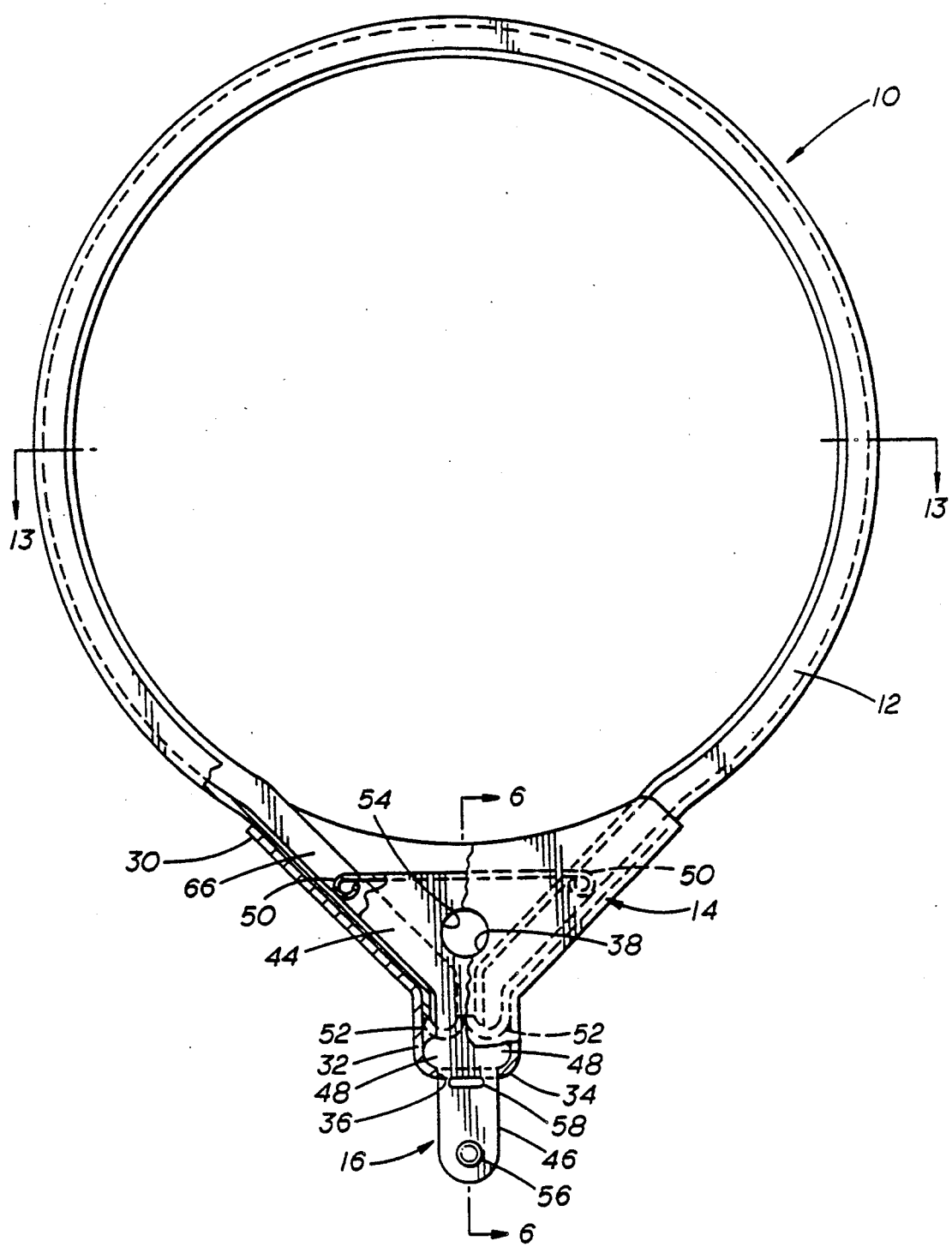
FIG. 1 is front view, partially in section, showing the first embodiment of the invention in the closed position.

Referring now to the drawings, and particularly to FIG. 13, the reference numeral 10 generally refers to the clamp ring of the present invention. The clamp ring 10 includes the split ring 12, which generally has a U-shaped cross section, a housing 14 which holds the ends of the ring, a spreader 16 which fits within the housing and between the ends of the ring 12, an optional lock guard 18, and is used in conjunction with the conventional barrel lock 20. Referring to FIG. 12 where a top view of an electric meter 22 is shown mounted on a meter box 24, the ring 12 is seen surrounding the outwardly facing flange 26 on the meter box 24, as well as the flange or base 28 of the meter 22. The method of holding the meter to the meter box, shown in FIG. 12 is conventional.

Referring now to FIG. 1, the clamp ring 10 is shown in its closed position. If it were installed on a meter base, the entire base would be surrounded by the ring 12 or by the housing 14. Notice that the housing 14 is of a general Y-shape, having a generally large mouth 30 which goes adjacent to the meter and the sides of the housing taper in to a relatively small throat 32 through which the spreader 16 extends. The housing 14 has a closed bottom 34, except for the elongate opening 36 through which the spreader 16 extends. The housing 14 also has a bolt hole 38 therein, which is sized to just accommodate the bolt 40 of the lock 20 when the retaining balls 42 (seen in FIGS. 6 and 13) are not extended.

The spreader 16 is also a generally Y-shaped member, the legs 44 of which conform to the angle of the mouth of the housing. The bottom of the spreader terminates in a stem 46 which extends through the elongated opening 36 of the housing. The stem may include centralizer tabs 48 on either side, which function to keep the stem centered in the throat 32 of the housing, as will be hereinafter explained.

Figures 5, 6, 7, 8:
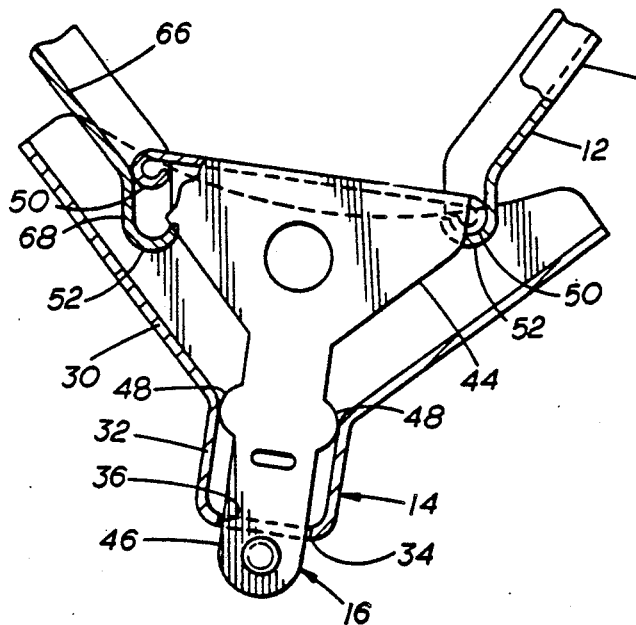
FIG. 5 is a further partial view similar to FIG. 1, showing the housing and spreader canted with respect to the ring in order to permit closing of the ring.
FIG. 6 is a partial sectional view, taken along the line 6—6 of FIG. 1 showing how a barrel lock may be utilized with the clamp ring.
FIG. 7 is a front view, partially in section of the spreader.
FIG. 8 is a sectional side view taken along the line 8—8 of FIG. 7.

Referring to FIGS. 7 and 8, at the top 60, and on either side of the spreader are shoulders 50 which are designed to catch and engage the inwardly shaped lugs 52 on either end of the ring 12. The spreader 16 also includes a bolt hole 54 which is the same size as the bolt hole 38 in the housing, and is coaxial therewith when the clamp ring is locked. The stem 46 of the spreader includes a stop, here shown as a rivet 56, at the bottom end, which functions to prevent the removal of the spreader from the housing after the rivet is inserted. Extending through the stem 46 of the spreader 16, and just below the bottom 34 of the housing 14 is a slot 58. This slot may be utilized for the insertion of a seal (not shown) in a conventional manner, to indicate whether the clamp ring has been removed or opened.

Referring now to FIG. 6, where a side view of the closed clamp ring 10 is shown, the alignment of the bolt hole 38 in the housing 14 with the bolt hole 54 in the spreader 16 is shown. It is also seen how the balls 42, when extended outwardly, prevent the bolt 40 from being inserted into, or removed from the clamp ring 10, simply because of the interference of the balls with the respective bolt holes. This general method of retaining a barrel lock in an opening is conventional. FIG. 6 further illustrates how the rivet 56 prevents the removal of the spreader 16 from the elongated opening 36 of the bottom 34 of the housing 14. The top 60 of the spreader is bent over so as to extend between the legs of the U-shaped ring 12 and the outer ends of the legs 44 of the spreader terminate in the shoulders 50, while the ends of the ring 12 are formed into lugs 52. The spreader 16 hole 54 is upset to form a reinforcement area 62 for the spreader within the housing. This is done to provide additional strength to the spreader hole 54, and may also be accomplished by attaching a ring in the same area. Referring to FIG. 13, an additional form of protection is shown in the lock guard 18. This optional guard may comprise a ring which is welded on or otherwise attached to the housing to surround the key portion 64 of the barrel lock 20, when it is inserted.

Referring again to FIG. 1, it will be noted that the ring 12, while being of U-shaped cross section, is formed to the general shape of a circle so that it will fit snugly over the mounting base of the electric meter 22. The ring is split in half, so that it may be separated enough to slip over the meter base 28 and the meter box flange 26. The open ends of the ring are formed into two arms 66 which are shaped to the same angle as the legs 44 of the spreader and the inside or mouth 30 of the housing. These arms are formed generally as a tangent to the ring 12. Then, the end of each arm is turned into a relatively short extension 68, the outer surface of which is parallel to the throat 32 of the housing, and thus almost radial to the ring. A detail of the end of one of the arms 66 is seen in FIGS. 9-11, and it will be noted that the extension 68 terminates in the inwardly shaped lug 52, previously noted. While the lug 52 generally runs across the width of the ring 12, an opening 70 must be provided so that the spreader 16 can be placed therein, as seen in FIG. 6.

Figure 2:
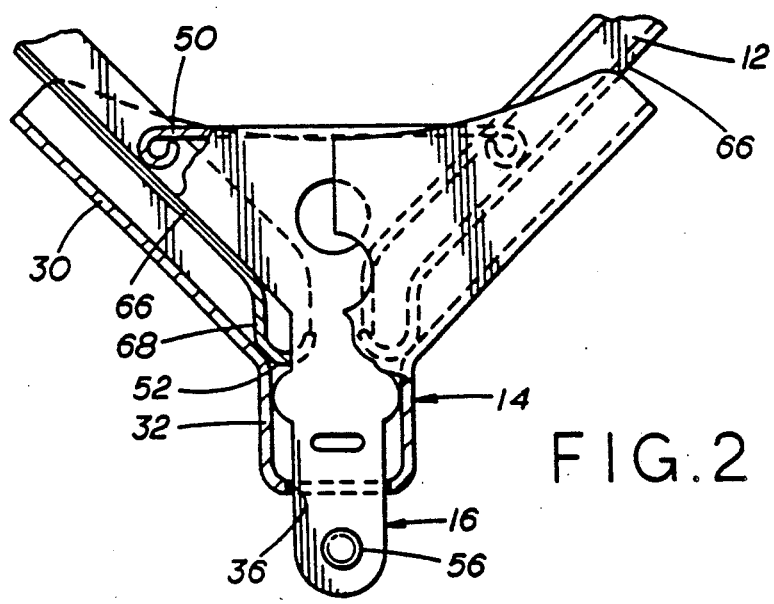
FIG. 2 is a partial view similar to FIG. 1, showing the housing as it has been pulled partially downwardly, and the beginning of the opening of the clamp ring.

The opening and closing of the clamp ring 10 will now be explained with reference to FIGS. 1 through 5. To open the clamp ring 10 from the closed position, as shown in FIG. 1, the lock is, of course, first removed from the bolt holes 38 and 54 in the housing and spreader, respectively. The seal, if any, is removed from the slot, 58. Thereupon, the housing 14 is grasped and pulled straight out, relative to the ring 12, as shown in FIG. 2. This action causes the extensions 68 of the arms 66 to be pulled out of the throat 32 of the housing. In so doing, the arms 66 of the ring 12 engage the shoulders 50 of the spreader and lift the spreader 16 upwardly relative to the housing 14.

Figure 3:
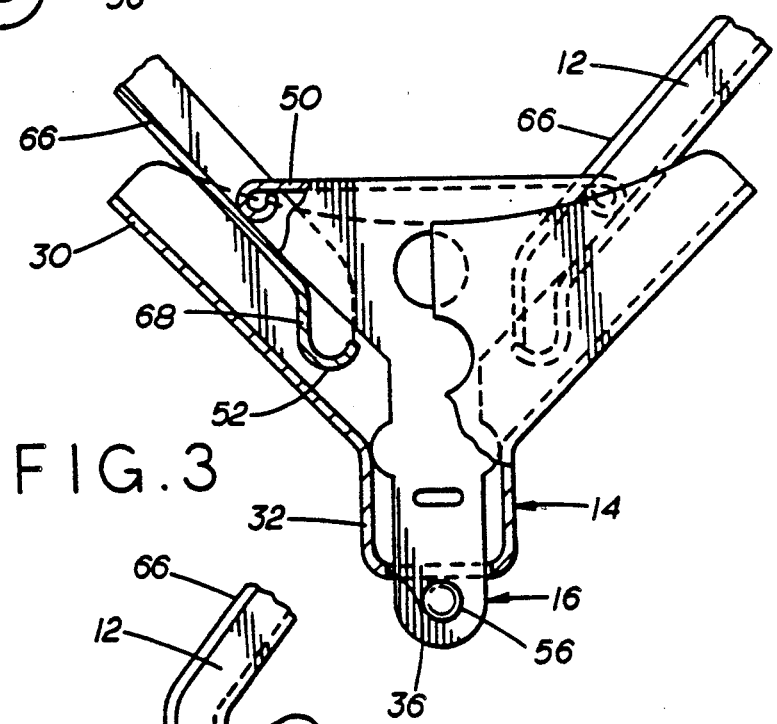
FIG. 3 is a partial view similar to FIG. 1, showing the housing pulled even further down, and the wedging action of the spreader opening the clamp ring.

Referring to FIG. 3, which is the unstressed position of the ring 12, further downward movement of the housing 14 relative to the ring 12 causes the spreader 16 to move even further upwardly until its progress is stopped by the stop or rivet 56 engaging the bottom 34 of the throat 32 of the housing 14. Since the extensions 68 of the arms are no longer constrained by the throat 32 of the housing, they begin to move substantially apart. This is aided by the caming or wedging action of the shoulders 50 of the spreader 16 engaging the insides of the arms 66. The nature of the geometry of the design is such that, as the ring is spread apart, the housing moves down a corresponding amount such that the lugs 52 move to a wider portion of the mouth of the housing; this increases the clearance to compensate for the spreading of the ring lugs, and thus avoids interference with the housing.

Figure 4:
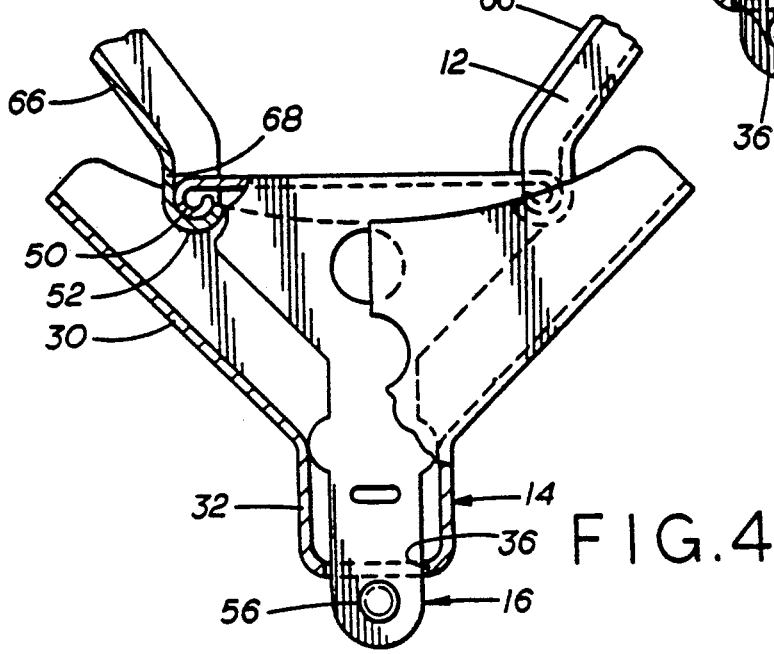
FIG. 4 is a partial further view, similar to FIG. 1, showing the ring in its wedged opened position with the housing and spreader being pulled to their most downward position.

Finally, as seen in FIG. 4, the shoulders 50 of the spreader 16 come into the radial extensions 68 of the arms 66 and engage the inwardly shaped lugs 52. The lugs prevent the ring from being pulled completely off of the spreader. This ends the downward movement of the housing, and also creates the widest opening apart of the arms 66 and therefore of the ring 12. Since the extensions 68 are basically parallel, the spreader, in the position shown in FIG. 4, with the shoulders engaging the lugs, is stable, and held open. The ring 12 may now be disengaged from the electric meter base 28 and the meter box flange 26.

To close the ring, one proceeds from the open position, shown in FIG. 4 to the canted or cocked position shown in FIG. 5. If one were to merely push up on the housing in an attempt to release the spreader, the housing would slide up relative to the ring and spreader until the housing mouth contacted the lugs. Further force would only be transmitted to the lugs, and no force would tend to release the spreader. Referring now to FIG. 5, the housing 14 is cocked relative to the ring 12 so as to slide one shoulder 50 of the spreader 16 out of the extension 68 of the arm 66 and away from the lug 52. The opposite shoulder 50 remains engaged with its lug 52, as shown to the right of FIG. 5. Meanwhile the centralizer tabs 48 serve, in combination with the engagement of the stem 46 of the spreader with the elongate opening 36 in the bottom 34 of the housing, to keep the spreader legs 44 in line with the mouth 30 of the housing, i.e., to keep the spreader centered in line with the housing. This cocking action allows the arm 66 to slide or cam along the shoulder 50, and for the extension 68 to move inwardly into the mouth 30 of the housing. Thereafter, the housing is pushed upwardly relative to the ring, is straightened out, and the arms of the ring are forced back toward each other by the Y-shape of the housing until both of the extensions 68 have snapped into the throat 32 of the housing, as shown in FIG. 1. At this point, the ring is closed to its fullest extent, and the lock may be inserted into the bolt holes, which are now aligned. If the spreader is not aligned, it may be, by simply pulling on its stem 46.

Referring now to FIGS. 14-21, a slightly different embodiment of the clamp ring 10 is shown. In this version, the arms of the ring have an additional curve in them, and the spreader is folded back over in the back, so that the stop or rivet may be fastened to the body, rather than to the stem of the spreader. This positioning also allows the rivet and slot in conjunction with the spreader stem to act as a centralizer, since in this embodiment the stem does not extend through the housing when the ring is open.

Figure 14:
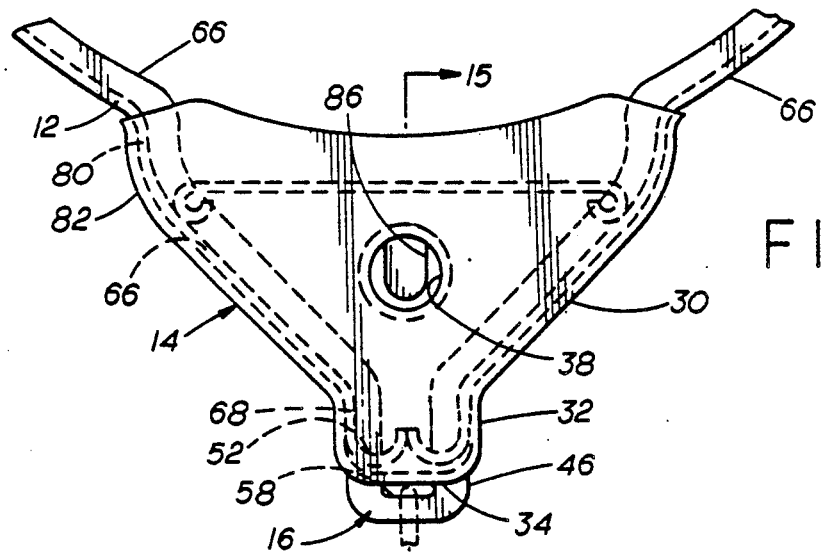
FIG. 14 is a front view, showing a second embodiment of the invention.
Figure 16:
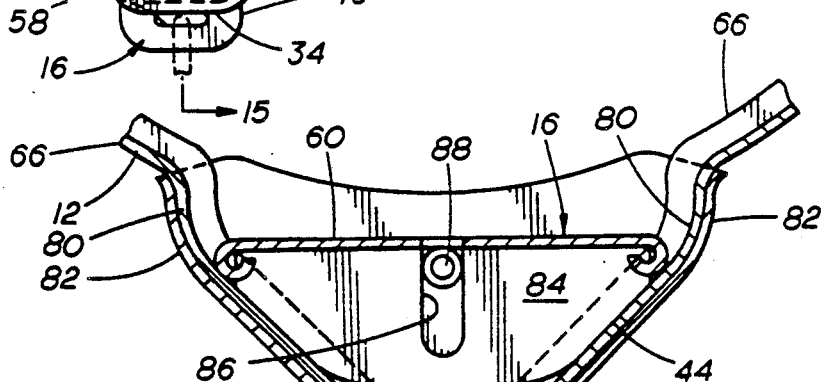
FIG. 16 is a partial sectional view, taken along the line 16—16 of FIG. 15.

As shown in FIG. 14, the split ring 12 includes two arms 66 which extend toward each other, and generally tangent to the remainder of the ring. However, before the tangent arm 66 is formed, the ring incorporates a generally radial portion 80. As before, the arm is terminated with a generally radial extension 68, with an inwardly shaped lug 52 at the end. The housing 14 is generally Y-shaped with a mouth 30 and a throat 32, as before. However, the extreme upper portion of the mouth bends inwardly, so as to approximate the radial portion 80 of the ring. The purpose of this radial portion 80 and the inward bend 82 of the housing 14 is to change the geometry of the housing adjacent to the ring when the clamp ring 10 is closed, and more particularly to make it even more difficult for a vandal to wedge a screwdriver, or other instrument, between the ring 12 and the housing 14, in the vicinity of the bend 82.

As before, the housing includes a bolt hole 38 in the face thereof. The spreader 16 extends beyond the bottom 34 of the housing 30, and, as before, includes a seal slot 58 in the stem 46 thereof.

Referring now to FIGS. 15, 17-19 and 20, the spreader 16 is more easily seen. As before, the legs 44 of the spreader are generally Y-shaped, to conform to the same shape of the housing 14. The stem 46 of the spreader is designed to pass through an elongate opening 36 in the bottom 34 of the housing. The spreader 16 is bent over at the top 60 and then downwardly in the back, much in the shape of an inverted "J". In the back 84 of the spreader 16 is formed a vertical slot 86. Corresponding to the slot, and set in the back of the housing is a stop or rivet 88 which is emplaced when the clamp ring is assembled. The rivet 88 acts to guide the spreader by means of the slot 86, in combination with the interaction of the stem 46 and the throat 32 of the housing. It also acts to limit both the upward and downward movement of the spreader 16, and to also prevent the spreader from cocking with respect to the housing 14. Thus, this combination of the rivet 88 and slot 86 serves to replace the centralizer tabs 48, the extended stem 46, and the rivet 56 shown in the prior embodiment.

Figure 17:
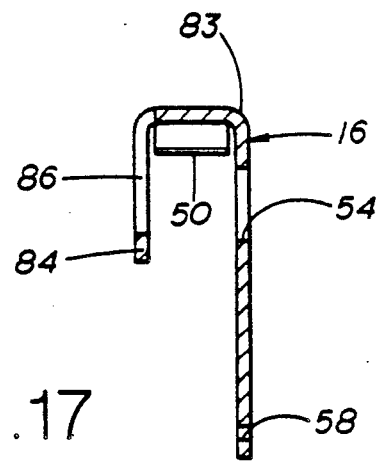
FIG. 17 is a sectional side view, taken along the line 17—17 of the FIG. 19.
Figure 18:
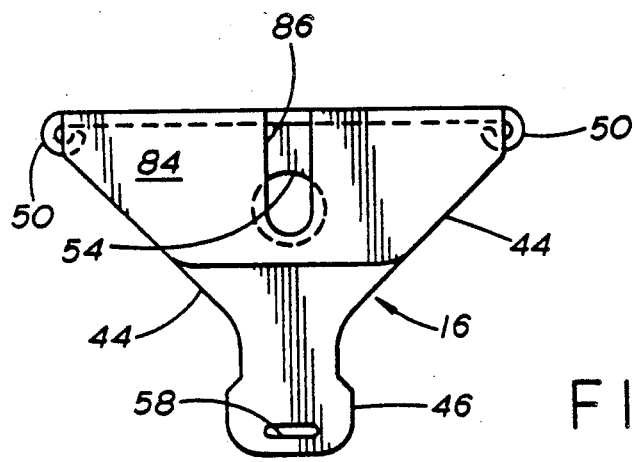
FIG. 18 is a back view of the spreader of the second embodiment.
Figure 19:
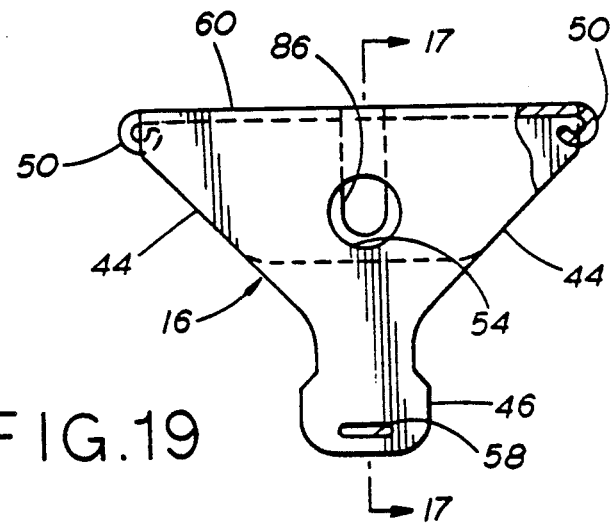
FIG. 19 is a front view, partially in section, of the spreader of the second embodiment.

As further seen in FIGS. 17-19 the outer ends of the legs 44 of the spreader terminate in shoulders 50. The front of the spreader 16 also incorporates a bolt hole 54 which aligns with the bolt hole 38 in the housing.

Figure 15:
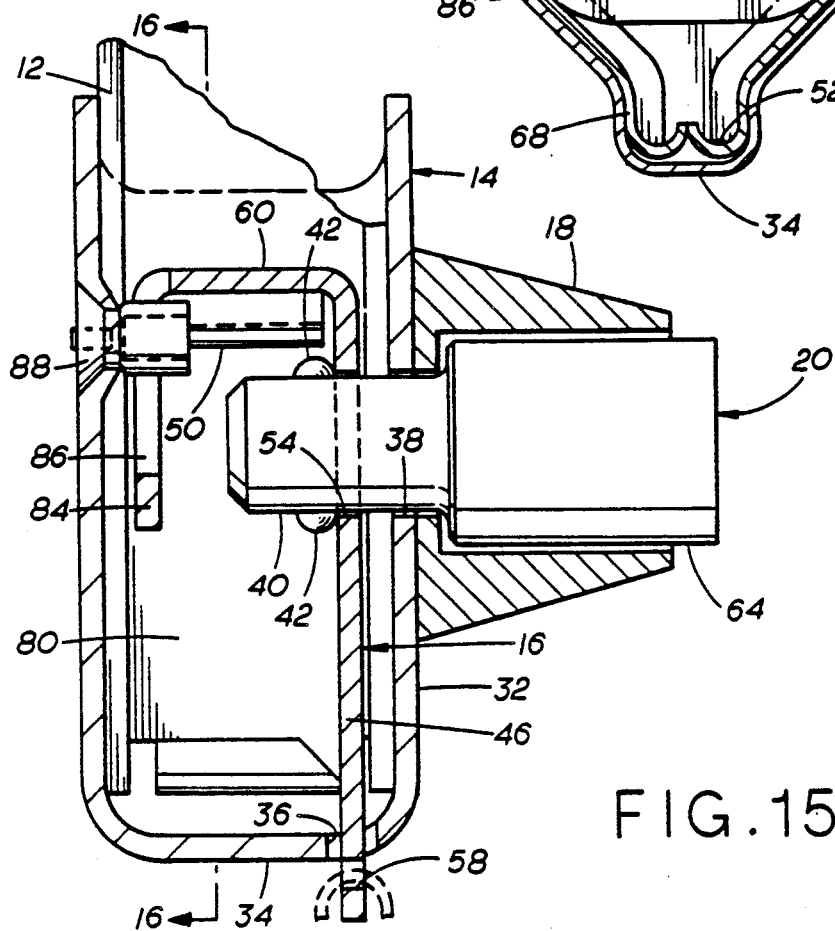
FIG. 15 is a side view, partially in section, taken along the line 15—15 of FIG. 14.

Referring to FIG. 15, the barrel lock 20 is shown inserted into the closed clamp ring 10, and more particularly, the bolt 40 extends through the bolt hole 38 in the housing and the bolt hole 54 in the spreader. Further, the retaining balls 42 are extended, thus preventing the removal of the bolt 40, which itself closely fits into the two bolt holes. Also illustrated in FIG. 15 is a lock guard 18 which surrounds the outer or key portion 64 of the barrel lock 20. The purpose of the lock guard is to shield the lock and to make it harder to grasp the look and pull it out illicitly. To this end, the lock guard may be made tapered, as shown.

Figure 21:
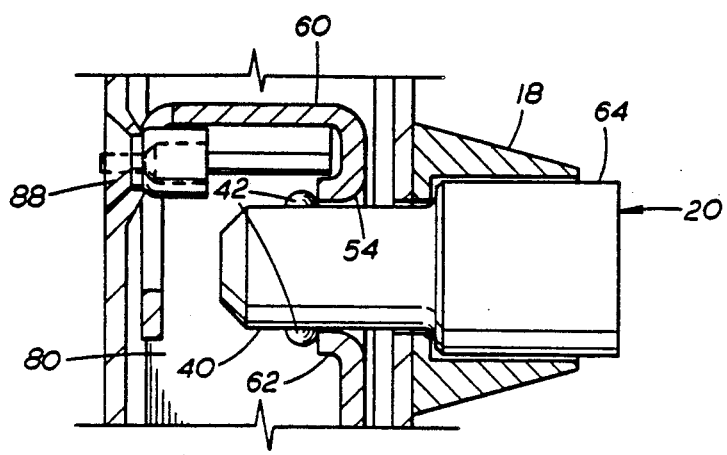
FIG. 21 is a sectional side view, similar to FIG. 15 and also taken along the line 15—15 of FIG. 14, showing the locked ring with a lock inserted, and showing a modified form of spreader with reinforcing ring.

A further modification of the spreader 16 is seen in FIG. 21. In this instance, the bolt hole 54 in the spreader is upset inwardly so as to form a reinforcement area 62, as in the prior embodiment. The reinforcement area 62 results in a somewhat stronger spreader. It also allows the use of a barrel lock 20 with a somewhat longer bolt distance between the retaining balls 42 and the key portion 64.

The operation of this second embodiment of the invention is virtually identical to the operation of the prior embodiment, and no further description thereof is felt necessary.

Referring now to FIGS. 22-26, which show another embodiment of the clamp ring. In this version the throat has been eliminated and an extra rivet 90 has been added to couple the spreader 91 to the housing 92 during the release operation. The spreader has been modified to match the housing shape at 93 and an extra slot 94 has been added to accommodate the extra rivet, a straight section 95 has been added at the top of the housing and the ring 96 is formed to match this shape and thus hold the ring in the closed position. Further differences will be evident from a comparison of the following discussion of the operation with those of the embodiments discussed earlier.

Figure 23:
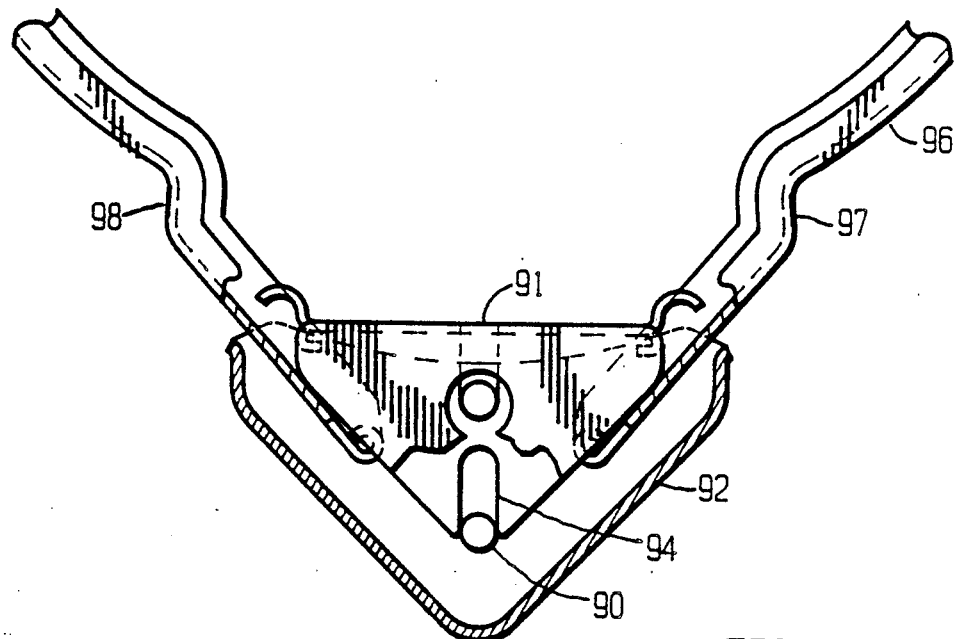
FIG. 23 is a partial view similar to FIG. 22 showing the housing as it has been pulled partially downward, allowing the clamp ring to spread partially open.
Figure 24:
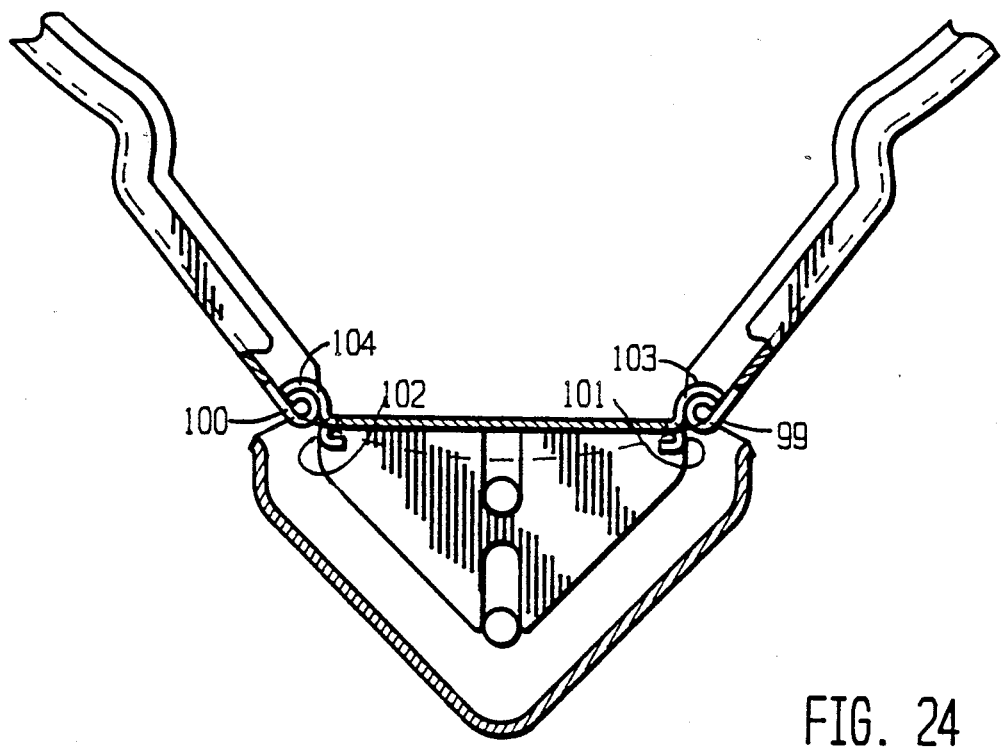
FIG. 24 is a further partial view similar to FIG. 22, showing the ring in its fully wedged open position.

Operation of this embodiment of the invention is shown in FIGS. 23-26. FIG. 23 shows the ring in the released position just after the housing 92 has been pulled away from the ring 96. The straight sectuibs 97 and 98 have been pulled far enough out of the housing to allow them to clear the housing as they are spread apart. The housing and spreader are pulled down caming the ring outward until the ends of the ring 99 and 100 snap into the straight sections of the spreader 101 and 102 as show in FIG. 24. At this point the hooks 103 and 104 at the top of the spreader prevent the spreader and housing from being pulled completely off of the ring. While in this position the ring is in a stable position and is held open by the spreader.

Figure 25:
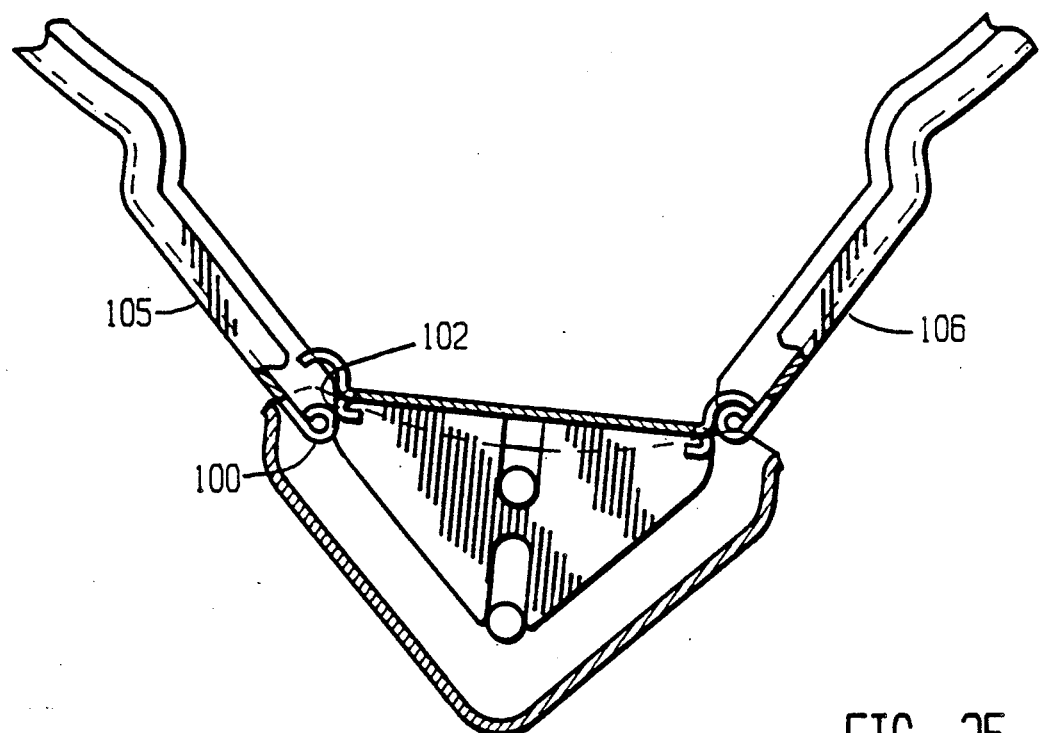
FIG. 25 is a further partial view, similar to FIG. 22, showing the slightly pivoted housing and spreader in the release position.
Figure 26:
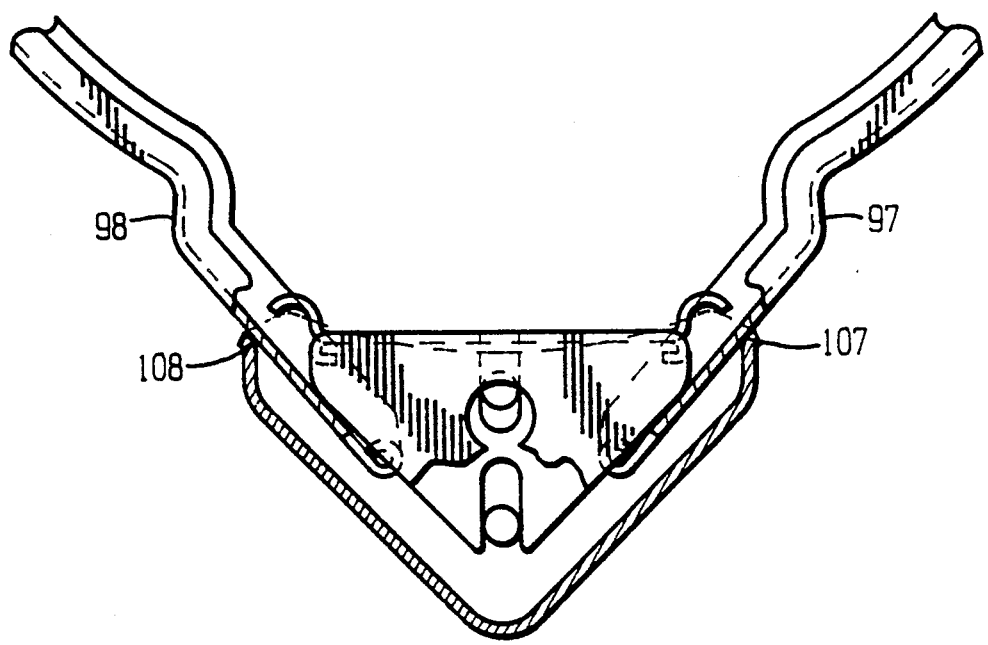
FIG. 26 is a further partial view similar to FIG. 22 showing the housing as it has been pushed partially upward, the clamp ring partially wedged closed.

In a manner similar to the earlier embodiments, to release the ring the spreader must be pivoted as shown in FIG. 25, so as to slip one of the ring ends 100 out of the straight sections 102 of the spreader and thus allow the ring ends 99 and 100 to clear the spreader and be forced inward to the closing position. The ring is closed by pushing the housing toward the ring as shown in FIG. 26. As the housing is pushed toward the ring the straight sections 105 and 106 of the ring ride on the side of the housing at 107 and 108 are thus camed inward until they reach the radial portions 97 and 98 which point they slip into the housing and the ring snaps into its closed configuration.

Figure 27:
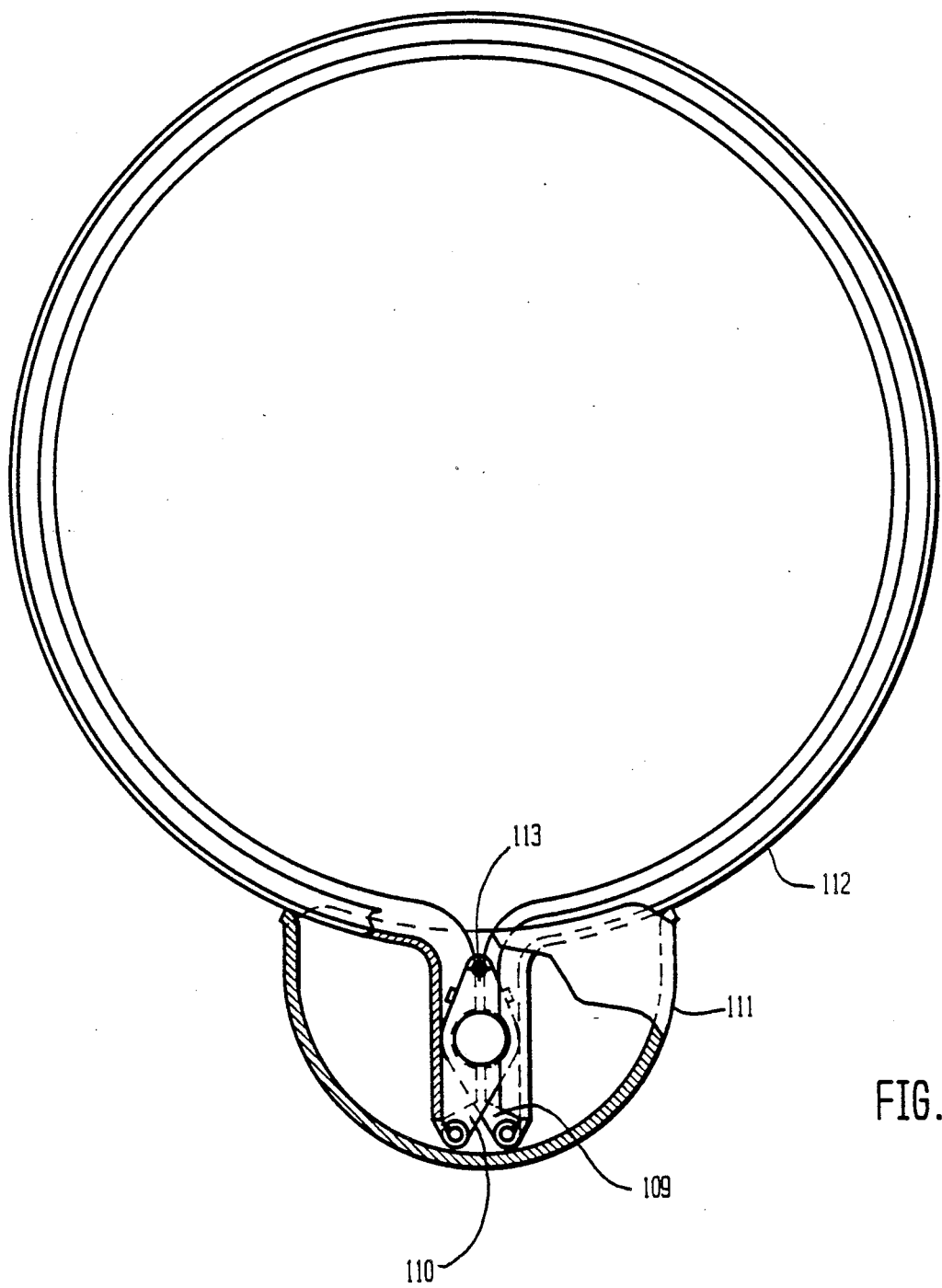
FIG. 27 is a front view, partially in section, showing the fourth embodiment of the invention in the closed position.
Figure 28:
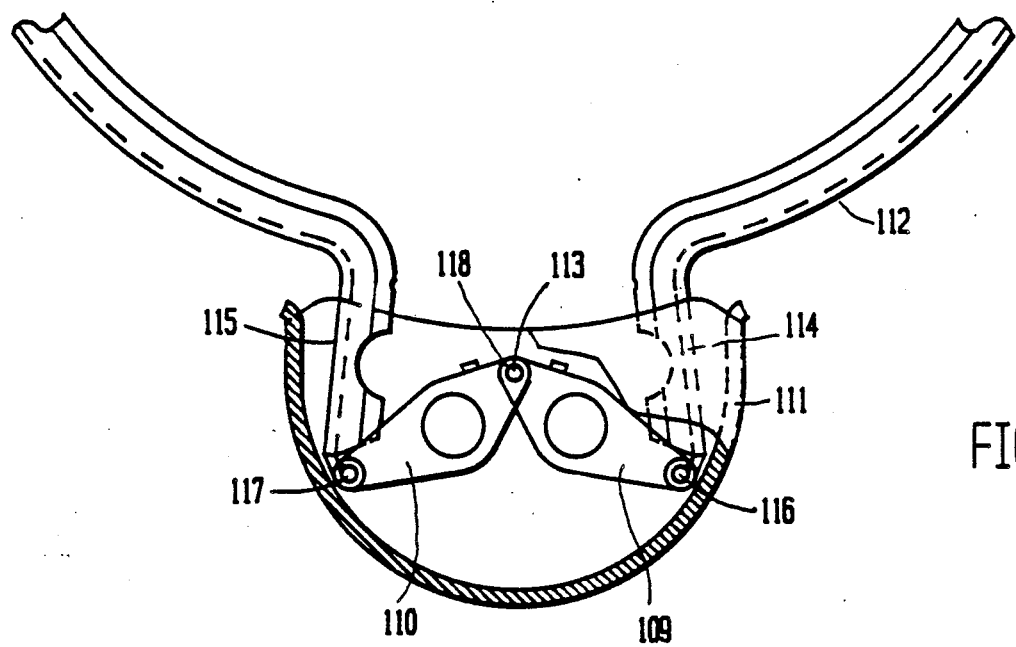
FIG. 28 is a partial view similar to FIG. 27 showing the housing as it has been pulled partially downward, the clamp ring partially wedged open.
Figure 29:
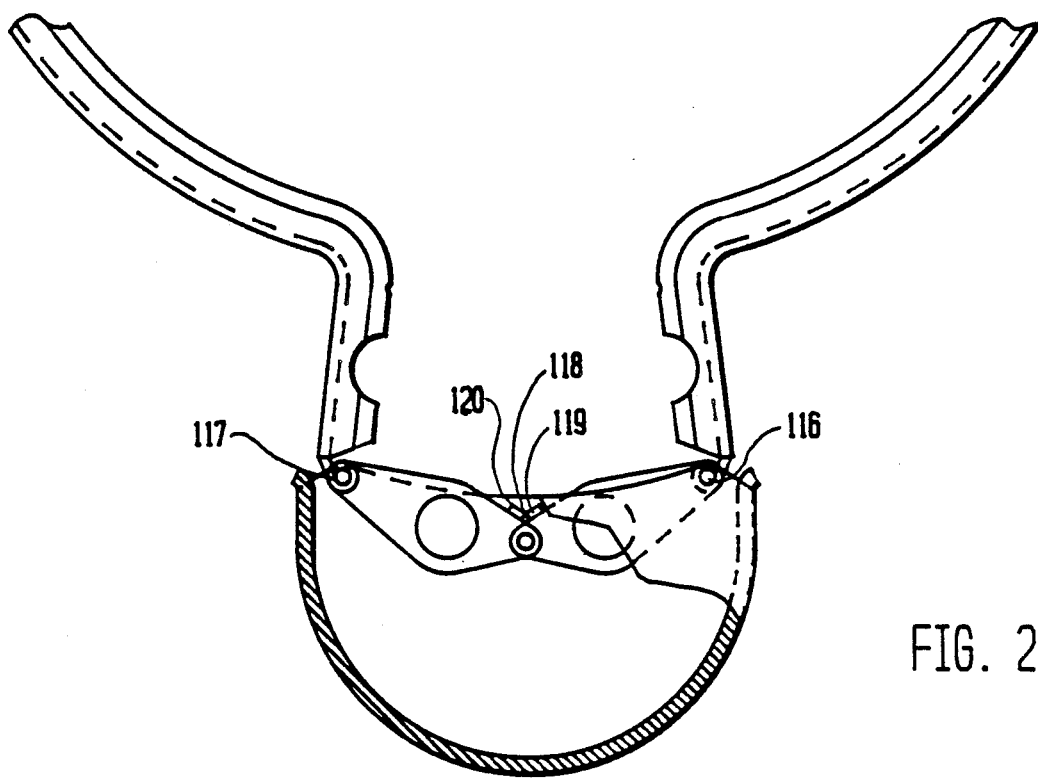
FIG. 29 is a further partial view similar to FIG. 27, showing the ring in its fully wedged open position.

FIGS. 27, 28 and 29 show another embodiment of the clamp ring. This version uses pivotal links 109 and 110 to open and close the ring. The operation is as follows when in the closed position FIG. 27 the lock is inserted in through the housing 111 and the spreader linkage 109 and 110. This pins the housing spreader linkages and prevents the housing from being moved relative to the ring 112, while also preventing the spreader linkages from being pivoted at pin 113. When the lock is removed from the assembly, the spreader linkages are free to pivot at the pin 113 and the ring ends 114 and 115 can then expand out. At this point the housing drops down as a pulling motion is exerted on it, away from the ring, the pin 113 forces the spreader linkages down which in turn forces the ring ends 114 and 115 outward, spreading the ring.

When pulled far enough the pivot points on the ring 116 and 117 and the pivot point on the spreader linkages 118 enter a configuration in which they have passed through a plane and are now non colinear. When in this toggled configuration the elasticity of the ring exerts an inward force on the spreader linkages which tends to make the spreader linkages pivot further at 118. Rotation beyond the point shown in FIG. 29 is prevented by the stop tabs 119 and 120 on the spreader linkages and thus the ring is held in a stable expanded position. To release the ring the housing is pushed toward the ring. This forces the pivot point 118 out of the stable position and back into the free position as shown in FIG. 28. At this point the housing can be pushed further toward the ring, this motion draws the spreader linkage pivot point 118 toward the ring which in turn draws the ring ends 114 and 115 the housing into the closed configuration ready to receive the lock through the aligned holes.

Figure 30:
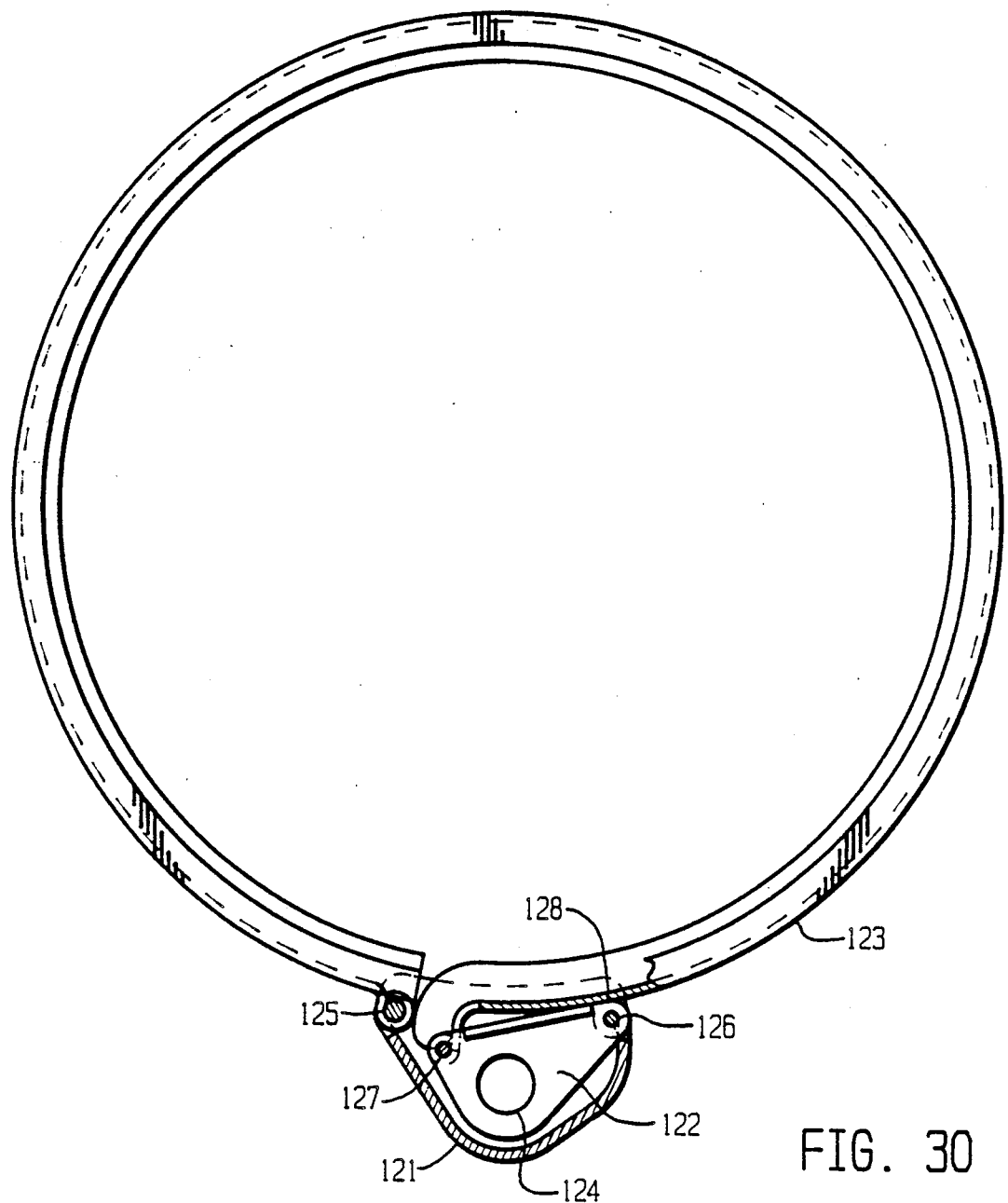
FIG. 30 is a front view partially in section, showing the fifth embodiment of the invention in the closed position.
Figure 31:
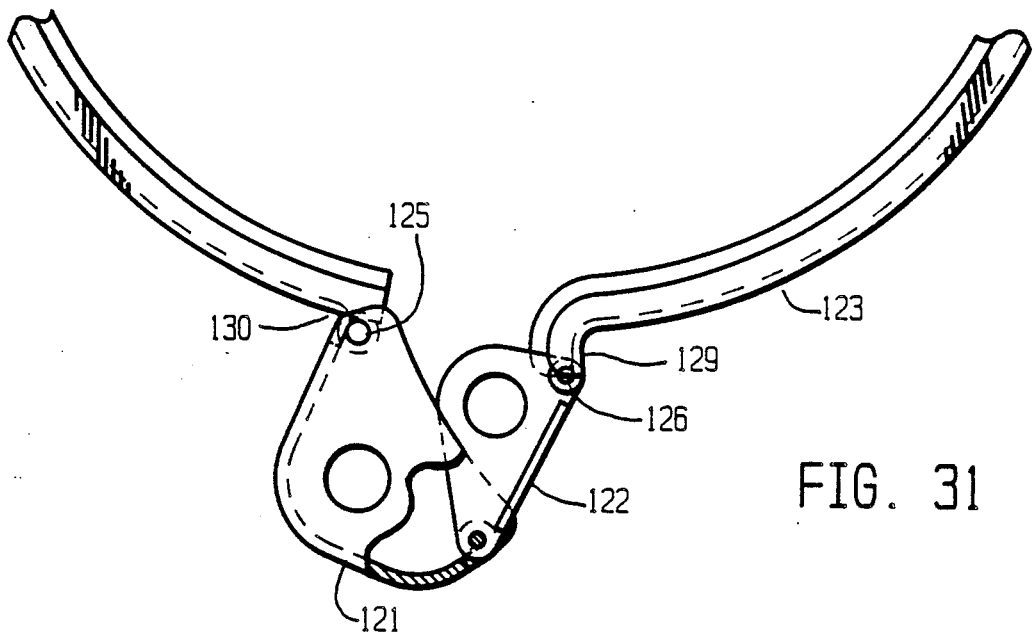
FIG. 31 is a partial view similar to FIG. 30 showing the housing as it has been rotated partially downward, the clamp ring partially wedged open.
Figure 32:
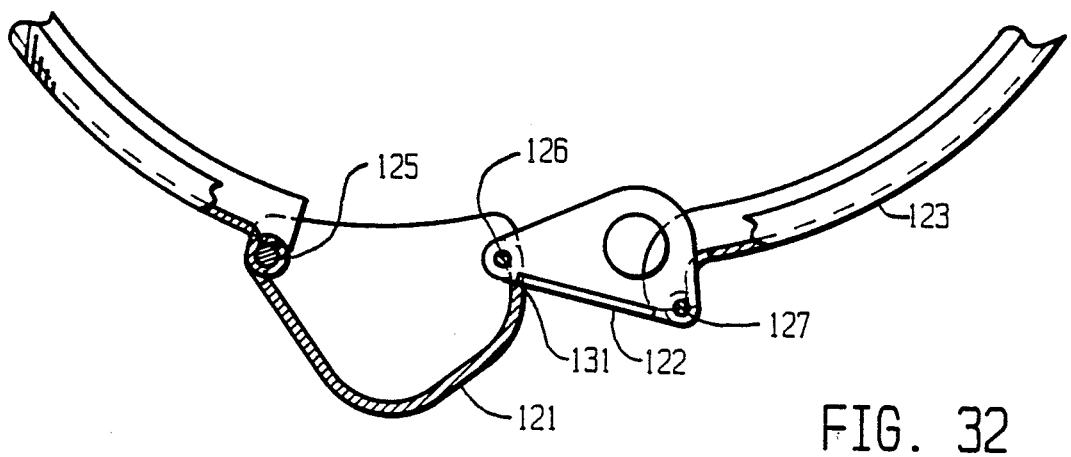
FIG. 32 is a further partial view similar to FIG. 30, showing the ring in its fully wedged open position.

FIGS. 30, 31, and 32 show yet another embodiment of the clamp ring. This version also uses pivotal links 121 and 122 and a toggle action to open and close the ring 123. The operation is as follows: when in the closed position FIG. 30 the lock is inserted in through the housing 121 at 124 and the spreader linkage 122. This pins the housing to the spreader linkage and prevents the housing from being pivoted at 125 while also preventing the spreader linkage from being pivoted at 126. When in the configuration shown in FIG. 30 the pivot points on the ring 125 and 127 and the pivot point on the spreader linkages 126 are in a configuration in which they are non colinear. When in this configuration the elasticity of the ring exerts an outward force on the spreader linkage which tends to make the spreader linkages pivot further counter clockwise at 126. Rotation beyond the point shown in FIG. 30 is prevented by contract of the spreader linkage at 128 with the ring and thus the ring is held in a stable closed position.

When the lock is removed the housing can be pulled away from the ring and thus pivoted at 126. As the housing is pulled away from the ring and thus pivoted in a clockwise direction about pivot point 125, the ring, housing and spreader enter the relaxed configuration as shown in FIG. 31. When the housing is pushed toward the ring while in the configuration shown in FIG. 31 the housing is forced to rotate in the counter clockwise direction about 125 while the spreader linkage is forced to rotate in a clockwise direction about 126. Rotation of the housing and spreader in this fashion causes the ring ends 129 and 130 to be forced outward until they snap into the configuration shown in FIG. 32 similar to the configuration shown in FIG. 29. The configuration shown in FIG. 32 holds the ring in a stable opened toggle configuration. Similar to the configuration in FIG. 30 the pivot points on the ring 125 and 127 and the pivot point on the spreader linkages 126 are in a configuration in which they are non colinear. When in this configuration the elasticity of the ring exerts an inward force on the spreader linkage and the housing which tends to make the spreader linkage pivot further clockwise at 126 while the housing tends to rotate further counter clockwise. Rotation beyond the point shown in FIG. 32 is prevented by contact of the spreader linkage with the housing at 131 and thus the ring is held in a stable open position.

Figure 33:
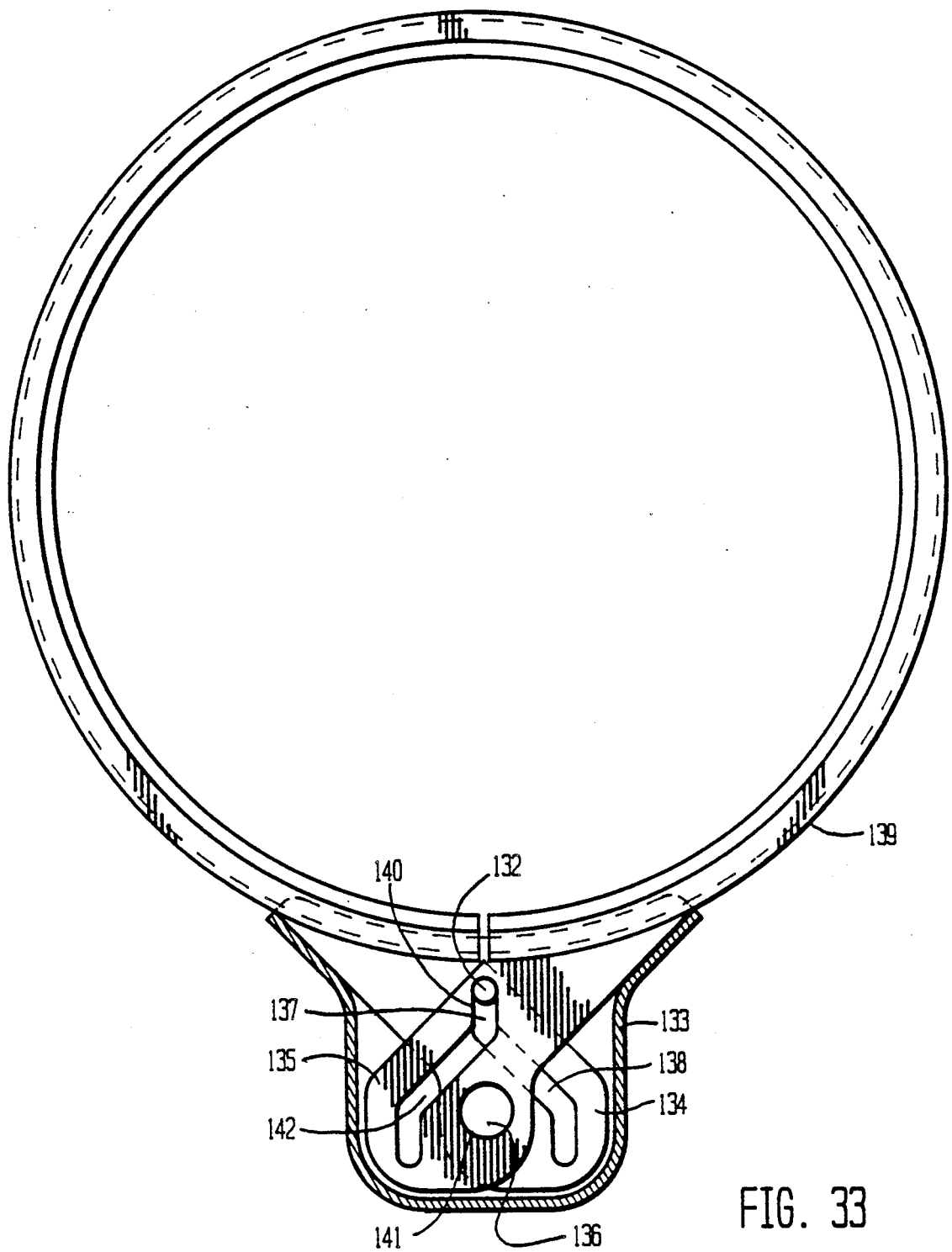
FIG. 33 is a front view, partially in section, showing the sixth embodiment of the invention in the closed position.
Figure 34:
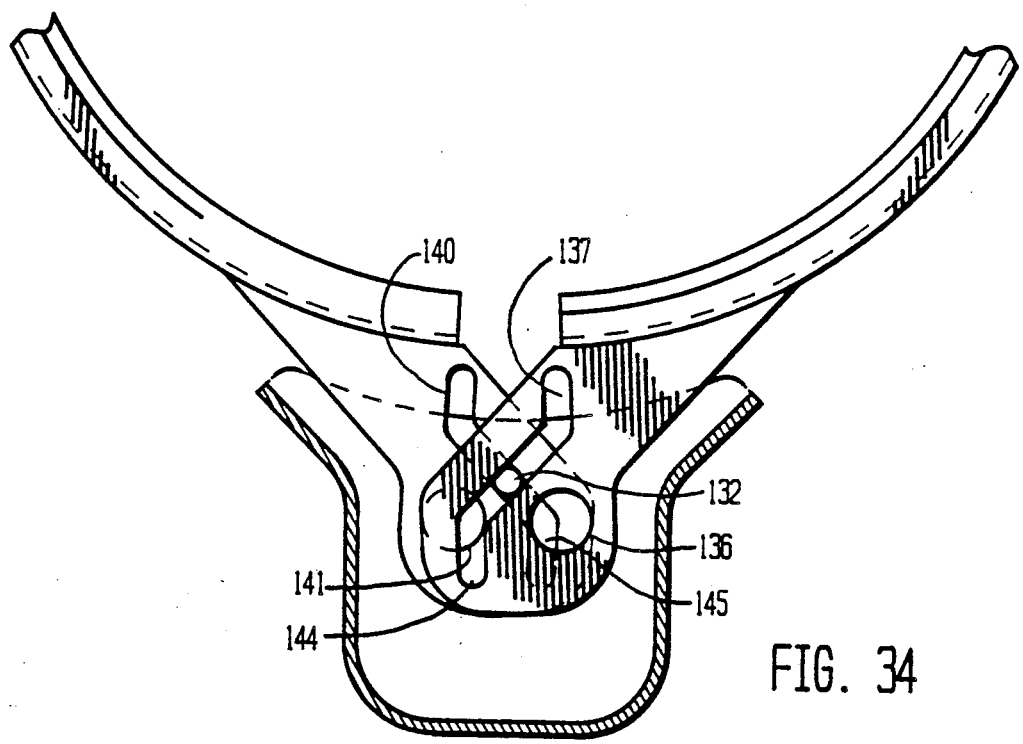
FIG. 34 is a partial view similar to FIG. 33 showing the housing as it has been pulled partially downward, the clamp ring partially wedged open.
Figure 35:
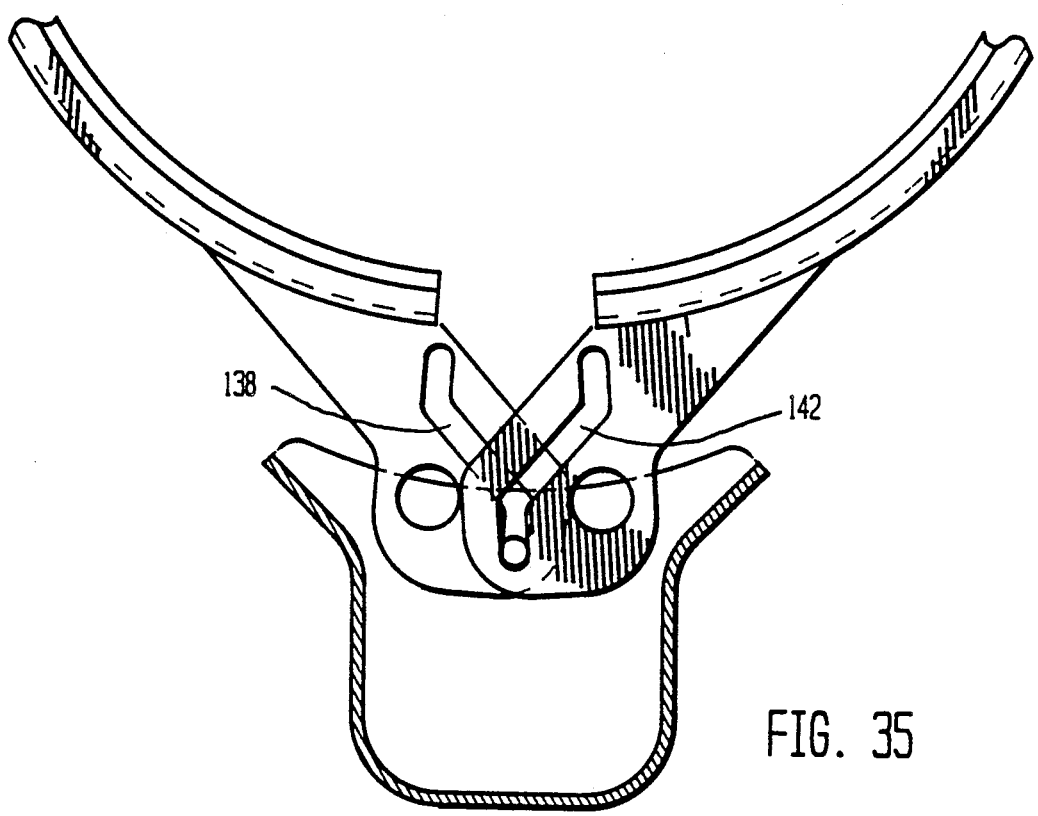
FIG. 35 is a further partial view similar to FIG. 33, showing the ring in its fully wedged open position.

FIGS. 33, 34 and 35 show another embodiment of the invention. In this version a pin 132, which extends through the housing 133, acts as the spreading means by interacting with slotted extensions 134 and 135, attached to each side of the ring 139. The lock is inserted through the housing and then through holes in the extensions 136 and 141. When the lock is in place, the housing cannot be pulled down in relation to the ring, and the lock pins the extensions 134 and 135 together preventing the ring from opening. The straight slotted section in the extensions 137 and 140 bear against the pin in the straight slotted section to hold the ring closed when the lock is not in place.

When the housing is pulled away from the ring the pin rides down the slots 137 and 140 in the extensions until it reaches the diagonal portion of the slots 138 and 142; at this point, the ring is free to expand outward as shown in FIG. 34.

As the housing is pulled away from the ring the pin 132, travels down each of the slots in the extensions 138 and 142, forcing the ends of the split ring apart until the pin finally reaches the straight sections 144 and 145 at the ends of the extensions at which point the housing, ring, and spreader pin snap into the configuration shown in FIG. 35. This configuration is then stable and hold the ring in the open configuration. To release the ring, the housing is pushed up and the procedure just described is reversed.

Figure 20:
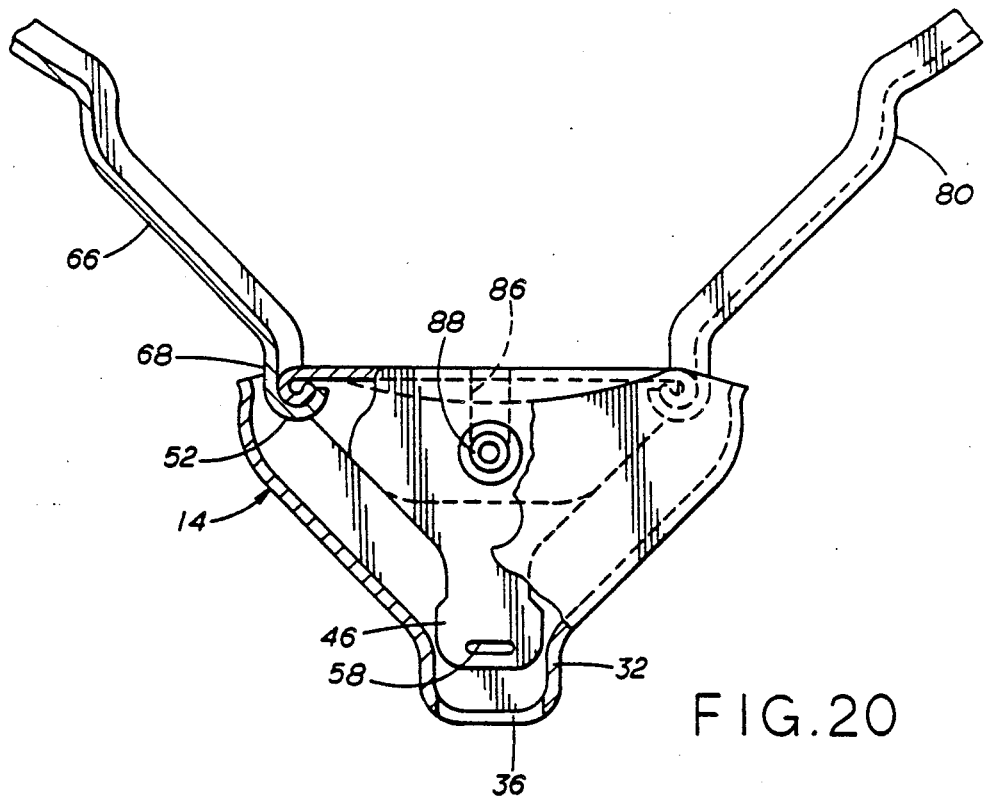
FIG. 20 is a partial sectional front view, similar to FIG. 14 except showing the clamp ring in an open position with the housing and spreader in their most downward positions.
Figure 22:
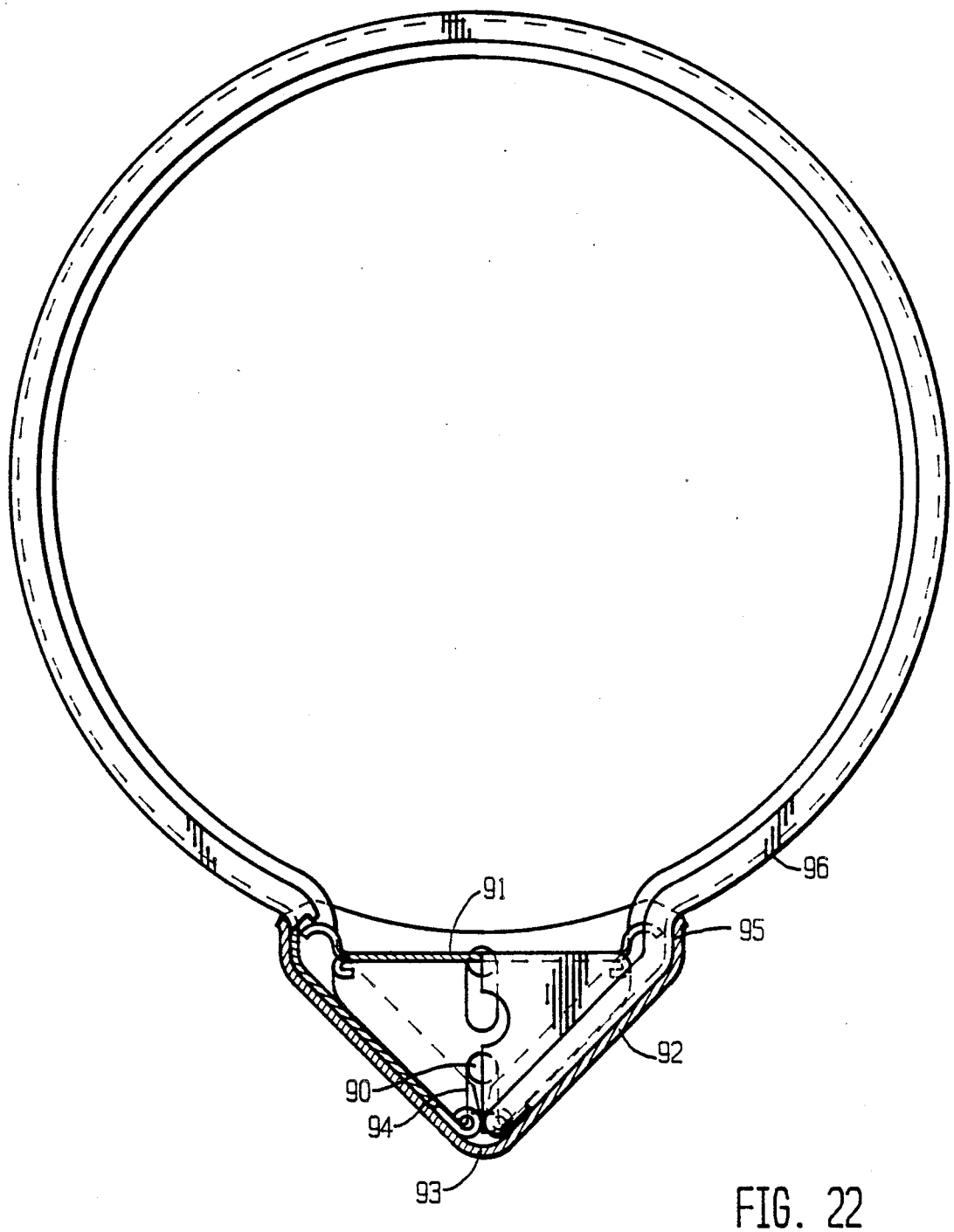
FIG. 22 is a front view, partially in section, showing the third embodiment of the invention in the closed position.
Figure 36:
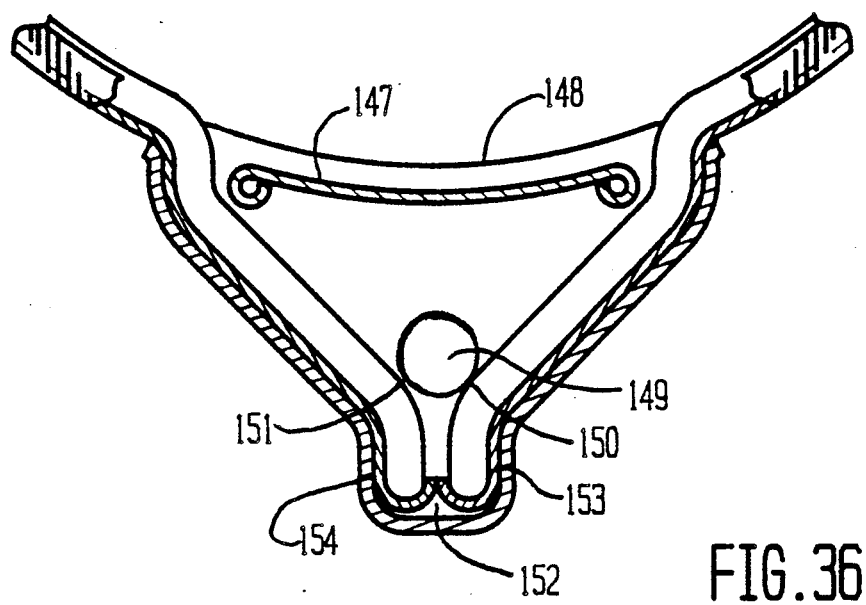
FIG. 36 is a rear view, partially in section, showing the seventh embodiment of the invention in the closed position.

FIG. 36 shows another embodiment which is similar to the versions shown in FIGS. 1, 20 and 22, however, in this version the spreader 147, is fixed to the housing 148, and does not move relative to it. The hole 149 in the housing is placed such that when the lock is inserted through it, it bears directly on the ring at 150 and 151. When the lock is in place the interference with the ring ends at 150 and 151 prevents the housing from being pulled down, thus the ring ends 153 and 154 cannot be removed from the cavity 152, and the ring remains constrained in the closed configuration. The spreader is attached to the housing in such a location that when the lock is removed there is sufficient clearance for the ring ends 153 and 154 to come out of the cavity 152 and be spread by the spreader. Operation of this version from this point is analagous to the versions shown in FIGS. 1, 20 and 22.

Referring to FIGS. 37 through 40 an embodiment of the present invention is shown which is similar to that shown in FIG. 22, however this embodiment differs because it has an insert 155 which interacts with the housing 156 ring 157 and spreader 158 and allows release of the ring from the opened position by merely pushing the housing towards the ring. This design allows the operator to release the ring from the opened position without having to rotate to the side as required by the embodiments shown in FIGS. 1, 20, 22 and 36.

Figure 37:
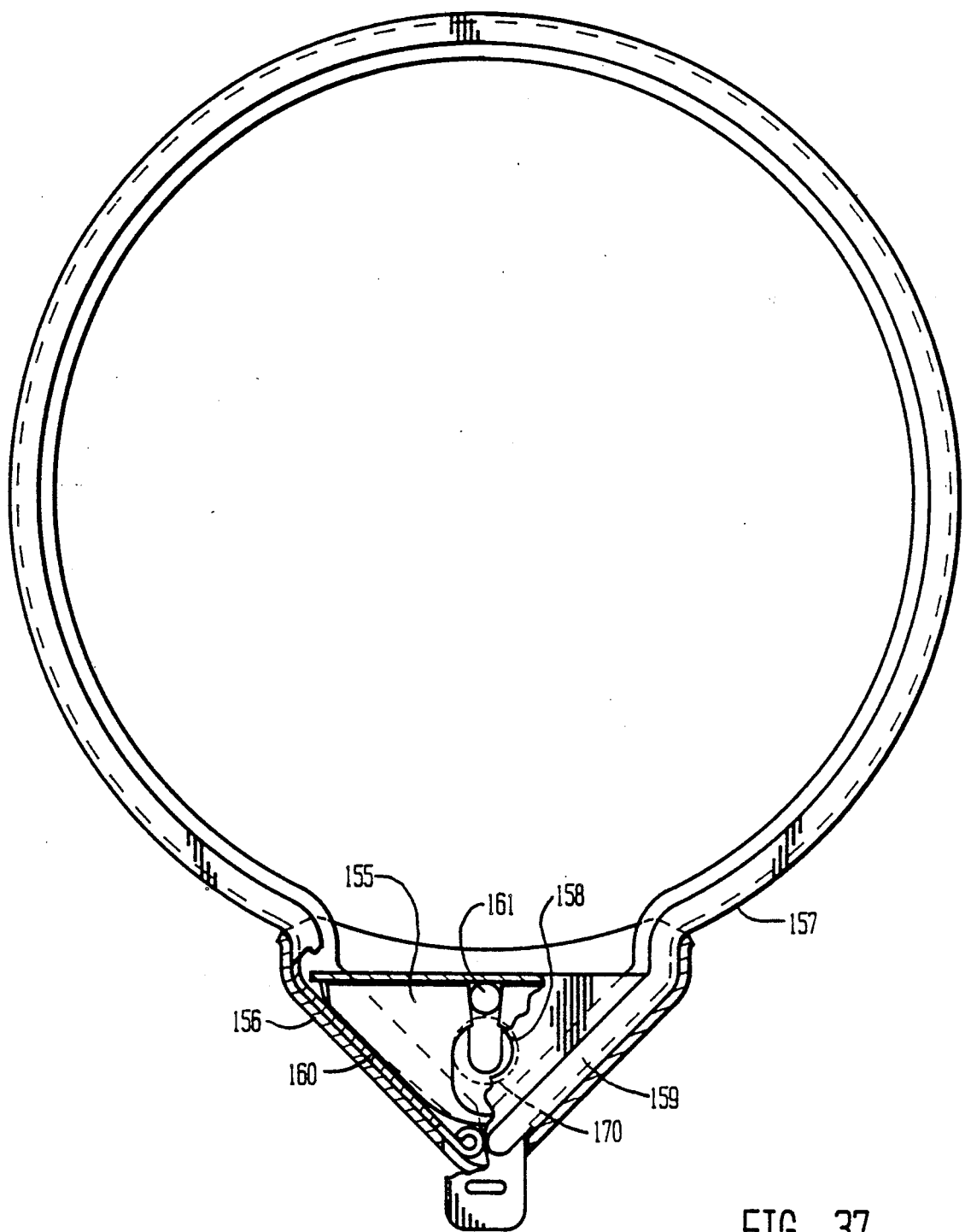
FIG. 37 is a front sectional view, showing the eighth embodiment of the invention in the closed position.
Figure 39:
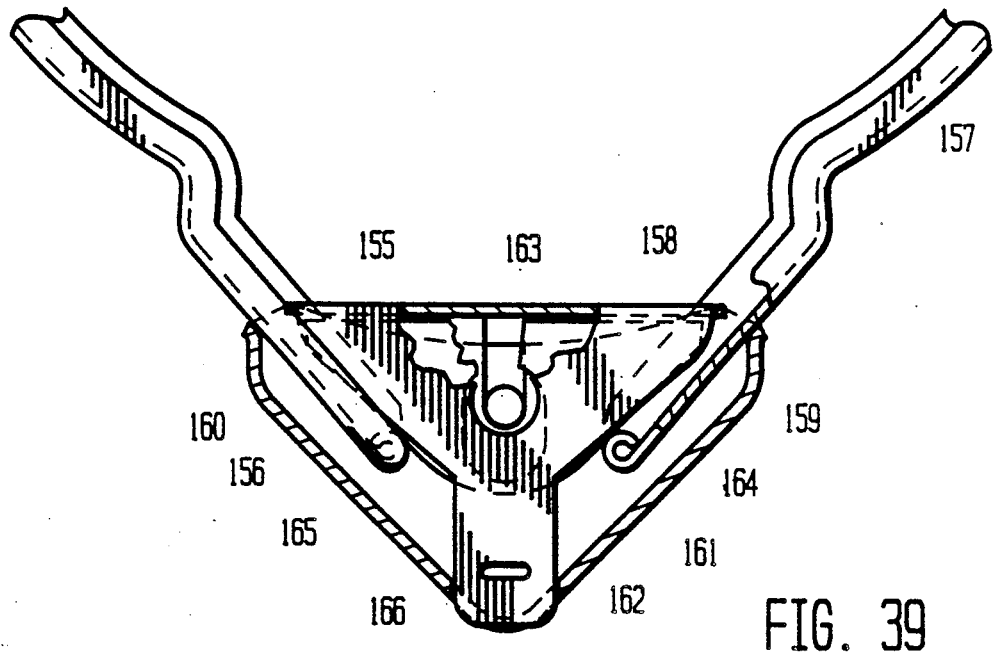
FIG. 39 is a front sectional view, showing the eighth embodiment of the invention in the opened, relaxed position.
Figure 40:
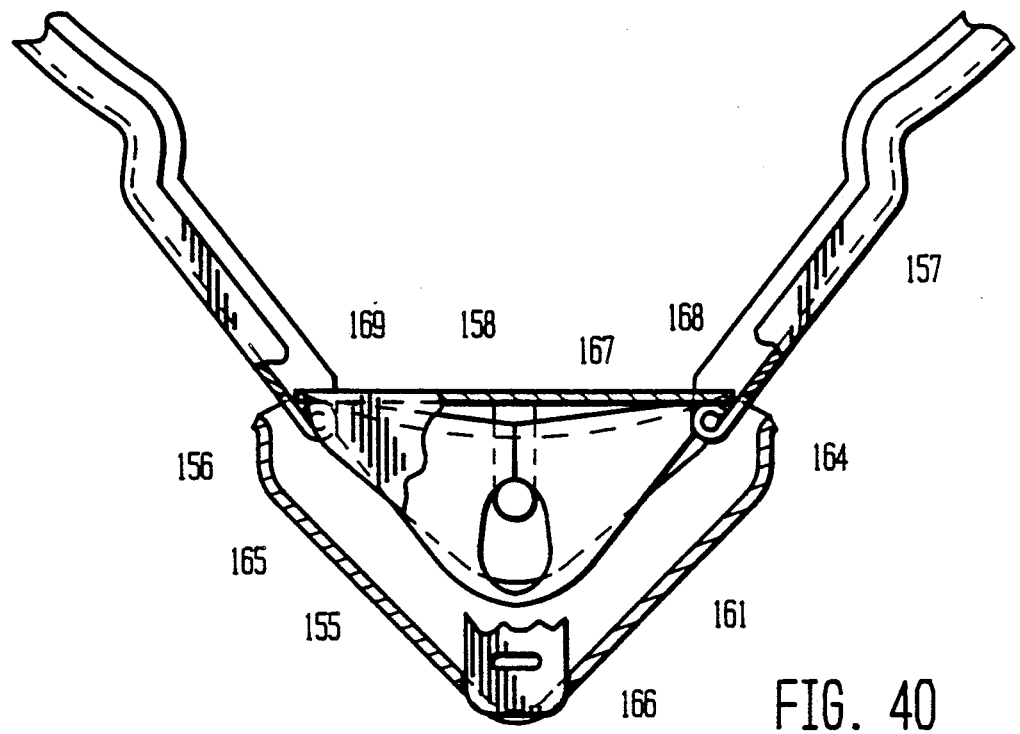
FIG. 40 is a front sectional view, showing the eighth embodiment of the invention in the fully opened position.
Figure 38:
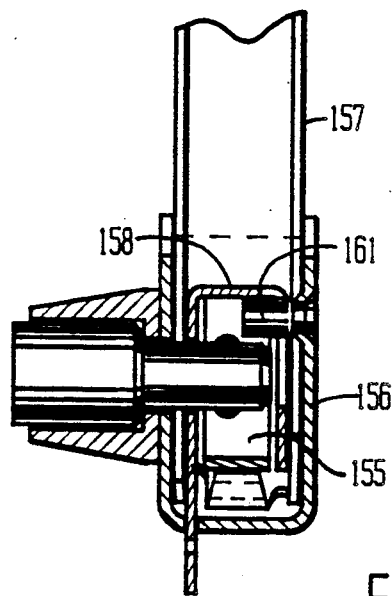
FIG. 38 is a side sectional view of the eighth embodiment of the invention in the closed position.
Figure 41:
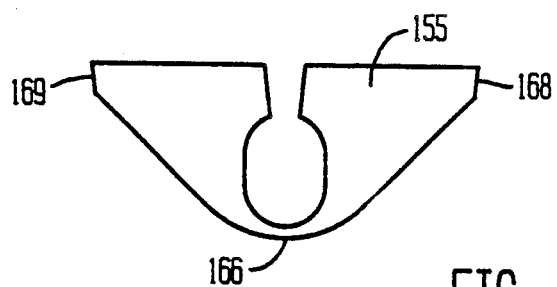
FIG. 41 is a front view of the insert.
Figure 42:
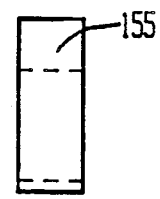
FIG. 42 is a right side view of the insert.

Operation of this embodiment of the invention is shown in FIGS. 37 through 40 and is similar in some respects to the operation of the embodiment shown in FIG. 22. FIG. 37 shows the ring 157, housing 156, spreader 158 and insert 155 in the closed position. The spreader and insert nest in the space between the ring lugs inside the housing. Once the lock has been removed from the lock hole who's position is represented by the dashed line 170, the housing can be pulled away from the ring releasing the ring lugs, allowing the ring lugs 159 and 160 to come out of the housing and move into the relaxed position as shown in FIG. 39. This frees the ring lugs 159 and 160 to be opened further by a wedging action of the spreader 158 and insert 155. As the housing is pulled further away from the ring, the rivet 161 contacts the spreader at 162 which forces it against the insert (generally at 163) which then contacts the curls 164 and 165 on the ends of the ring lugs causing the ring to be spread by a wedging action of the insert. The insert has a thinned section at 166 which allows it to flex in that area and eventually close down at 167 above the rivet when the ring is in the opened position, FIG. 40. By closing down above the rivet 161 the spreader and insert assembly become immobilized relative to the housing 156. In this configuration any force applied to the housing is in turn transmitted to the spreader and insert assembly through the rivet, thus if it is desired to release the ring lugs from their opened position the operator simply pushes the housing generally towards the ring. This action simply slides the curls 164 and 165 off of the flats 168 and 169 on the insert and the spring action of the ring drives the spreader and insert towards their relaxed positions as shown in FIG. 39 ready to be closed in a manner analogous to the embodiment shown in FIG. 22.

Thus, it is seen that the clamp ring of the present invention provides a unique and unitary clamp ring particularly useful in holding electric meter bases to meter housing flanges. However, in a similar manner, the clamp ring may be used to secure other types of devices together, and the scope of the invention is to be limited only by the claims. The present invention, therefore, is well adapted to carry out the objects and attain the ends and advantages mentioned, as well as other inherent therein. While the presently preferred embodiments have been given for the purpose of disclosure, numerous changes in the details of construction, and the combination, shape, size and arrangement of the parts and uses may be resorted to without departing from a spirit and scope of the invention.

What is claimed is:

1. In a meter clamp ring assembly for securing a meter to a flanged meter housing by means of a split ring, having a generally U-shaped cross-section which surrounds the meter base and flange on the housing, the improvement comprising:
    (a) the ring at the split having ends,
    (b) a housing moveable radially in the plane of the ring,
    (c) the housing enclosing spreading means that interact with the ends of the ring to contract and hold the ends of the ring together when the housing is moved generally radially in the place of the ring to a first position, and spread the ring ends apart when the housing is moved generally radially in the plane of the ring to a second position; and (d) the housing, when in the first position, having a hole therein for the insertion of a lock to secure the housing in the first position.

2. The invention of claim 1 including the spreading means and housing being stable when in the second position.

3. The invention of claim 1 including said ring and housing remaining as a unit during normal operation.

4. The invention of claim 1 including means in combination with the ring and housing to hold the ring in the closed position.

5. The invention of claim 1 wherein the spreading means includes cams.

6. The invention of claim 1 wherein the spreading means includes pivotal links.

7. The invention of claim 6 wherein the links include a toggle.

8. The invention of claim 2 including the spreading means and housing being stable when in the first position.

9. In a meter clamp ring assembly for securing a meter to a flanged meter housing by means of a split ring, having a generally U-shaped cross-section which surrounds the meter base and flange on the housing, the improvement comprising:

(a) a ring at the split having ends, (b) a housing, moveable radially in the plane of the ring, (c) the housing enclosing spreading means that interact with the ends of the ring to contract and hold the ends of the ring together when the housing is moved generally radially in the plane of the ring to a first position, and spread the ring ends apart when the housing is moved generally radially in the plane of the ring to a second position, (d) the housing, when in the first position, having a hole therein for the insertion of a lock to secure the housing in the first position; and (e) the spreading means including an insert on which the ring ends rest when in the second position.

10. The invention of claim 9 wherein the insert is flexible and includes a slot which is closed by the ends of the ring when the housing is in the second position.

11. The invention of claim 9 wherein the insert is generally an isosceles triangle in shape, with the ends of the equal legs ending in flats perpendicular to the base of the triangle, upon which flats the ring ends rest when in the second position.

12. The invention of claim 10 including a rivet attached to the housing and extending into the closed slot of the insert when the housing is in the second position.

13. The invention of claim 10 including releasing means attached to the housing and inacting with the spreading means and insert to release the spreading means from the second position when the housing is urged toward the first position.

* * * * *